(12) United States Patent
Coban et al.

(10) Patent No.: US 8,749,417 B2
(45) Date of Patent: Jun. 10, 2014

(54) MULTI-MODE ANALOG-TO-DIGITAL CONVERTER

(75) Inventors: Abdulkerim L. Coban, Austin, TX (US); Clayton H. Daigle, Austin, TX (US); Alessandro Piovaccari, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 1 day.

(21) Appl. No.: 13/344,143

(22) Filed: Jan. 5, 2012

(65) Prior Publication Data

US 2013/0117790 A1      May 9, 2013

Related U.S. Application Data

(60) Provisional application No. 61/556,263, filed on Nov. 6, 2011.

(51) Int. Cl.
    *H03M 3/00*      (2006.01)
    *H03M 1/12*      (2006.01)
    *H03M 7/20*      (2006.01)

(52) U.S. Cl.
    CPC   *H03M 1/12* (2013.01); *H03M 3/00* (2013.01); *H03M 7/20* (2013.01)
    USPC .............................. 341/143; 341/155; 341/156

(58) Field of Classification Search
    CPC ....................................................... H03M 1/12
    USPC .......................................... 341/143, 155, 156
    See application file for complete search history.

(56) References Cited

U.S. PATENT DOCUMENTS

| | | | |
|---|---|---|---|
| 5,892,836 A | * | 4/1999 | Ishige et al. ................... 381/316 |
| 7,928,878 B1 | | 4/2011 | Coban et al. |
| 2007/0287402 A1 | * | 12/2007 | Feng et al. ..................... 455/323 |

OTHER PUBLICATIONS

Balmelli, Pio, and Huang, Qiuting, "A 25MS/s 14b 200mW ΣΔ Modulator in 0.18βm CMOS," 2004 IEEE International Solid-State Circuits Conferences, Session 4, Oversampled ADCs, Paper 4.2, Jun. 2004, 10 pages.

Yaghini, Navid and Johns, David, "A 43mW CT Complex ΣΔ ADC with 23MHz of Signal Bandwidth and 68.8dB SNDR," 2005 IEEE International Solid-State Circuits Conference, Session 27, Filters and Continuous-Time ΣΔ Converters, Paper 27.6, Digest of Technical Papers, Feb. 2005, 3 pages.

Yan, Shouli and Sanchez-Sinencio, Edgar, "A Continuous-Time ΣΔ Modulator with 88dB Dynamic Range and 1.1MHz Signal Bandwidth," 2003 IEEE International Solid-State Circuits Conference, Session 3, Oversampled A/D Converters, Paper 3.5, Sep. 2003, 10 pages.

\* cited by examiner

*Primary Examiner* — Jean B Jeanglaude
(74) *Attorney, Agent, or Firm* — Abel Law Group, LLP

(57) ABSTRACT

A method of configuring an analog-to-digital converter (ADC) includes configuring the ADC to operate in one of a low-pass filter mode and a band-pass filter mode according to a value of a control signal. In at least one embodiment, the method further includes configuring an integrator gain of the ADC and a feed-forward gain of the ADC based on selection of one of a low-intermediate frequency (LIF) mode and a zero-intermediate frequency (ZIF) mode.

22 Claims, 9 Drawing Sheets

MULTI-MODE ANALOG-TO-DIGITAL CONVERTER

CROSS-REFERENCE TO RELATED APPLICATION(S)

This application claims benefit to provisional application 61/556,263, filed Nov. 6, 2011, entitled "Multi-Mode Analog-to-Digital Converter," naming Abdulkerim L. Coban, Clayton H. Daigle, and Alessandro Piovaccari as inventors, which application is incorporated herein by reference in its entirety.

BACKGROUND

1. Field

The present application is related to analog-to-digital converters and more specifically to multi-mode analog-to-digital converters.

2. Description of the Related Art

Analog-to-digital converters (ADCs) are used widely in signal processing chains ranging from low-frequency applications (e.g., instrumentation, voice, audio, etc.) to relatively high-frequency applications (e.g., DSL, WiFi, TV). Typically, for high-frequency applications such as analog and digital TV (e.g., where channel bandwidth may be between 6 and 8 MHz for terrestrial and cable signals and up to 30 MHz for satellite signals), low oversampling ratio (OSR), higher order delta-sigma modulators with multi-bit quantizers are often used. Some delta-sigma modulators employ distributed feed-forward (DFF) topologies, which may feature reduced internal signal swings and may use fewer feedback digital-to-analog converters (DACs). However, DFF topologies may increase effects of interfering signals, such as by increasing out-of-band signal transfer function (STF) peaking The peaking may be more pronounced in ADCs with multi-bit quantizers because more aggressive loop scaling can be done without compromising loop stability compared to delta-sigma modulators with single-bit quantizers.

Out-of-band STF peaking is a serious concern for applications where large close-in blockers may be present in the vicinity of the desired channel (e.g., television applications). A baseband or intermediate frequency (IF) filter preceding the ADC may not reduce these blockers sufficiently to ensure stability of the ADC. Although the ADC input level may be increased to ensure that residual blockers do not overload the ADC, a reduction in the ADC input level may reduce the in-band dynamic range of the ADC. Further, blockers may appear at varying frequencies, which may make accounting for the blockers a significant design challenge, potentially increasing cost and complexity of the ADC.

SUMMARY

In at least one embodiment of the invention, an apparatus includes a delta-sigma modulator configurable to operate in a low-pass filter mode and further configurable to operate in a band-pass filter mode. The apparatus further includes selection logic coupled to the delta-sigma modulator, the selection logic configured to select between at least a first signal and a second signal to be input to the delta-sigma modulator. In at least one embodiment of the apparatus, in the low-pass filter mode the delta-sigma modulator is configured as a fifth-order delta-sigma modulator, and in the band-pass filter mode the delta-sigma modulator is configured as a fourth-order delta-sigma modulator.

In at least one embodiment of the invention, a method of configuring an analog-to-digital converter (ADC) includes configuring the ADC to operate in one of a low-pass filter mode and a band-pass filter mode according to a value of a control signal. In at least one embodiment, where a complex signal processing path is employed (i.e. in-phase plus quadrature paths), the method further includes configuring an integrator gain of the ADC and a feed-forward gain of the ADC based on selection of one of a low-intermediate frequency (LIF) mode and a zero-intermediate frequency (ZIF) mode.

In at least one embodiment of the invention, an apparatus includes an analog-to-digital converter (ADC). The ADC includes several configurable integrators, which can be disabled in response to a control signal. For example, in one embodiment, the ADC includes a first integrator, a second integrator, a third integrator, a fourth integrator, and a fifth integrator. The fifth integrator is configurable to be disabled in response to a control signal. In at least one embodiment of the apparatus, a disabled state of the fifth integrator corresponds to a band-pass filter mode, the band-pass filter mode associated with a higher intermediate frequency (e.g., 36 MHz) (in the context of TV tuners and receivers, a specific value of this higher IF is called standard IF, e.g. 36 MHz for European TV standards) mode of the ADC, and an enabled state of the fifth integrator corresponds to one of a first low-pass filter mode and a second low-pass filter mode, the first low-pass filter mode associated with a low-intermediate frequency (LIF) mode of the ADC and the second low-pass filter mode associated with a zero-intermediate frequency (ZIF) mode of the ADC.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
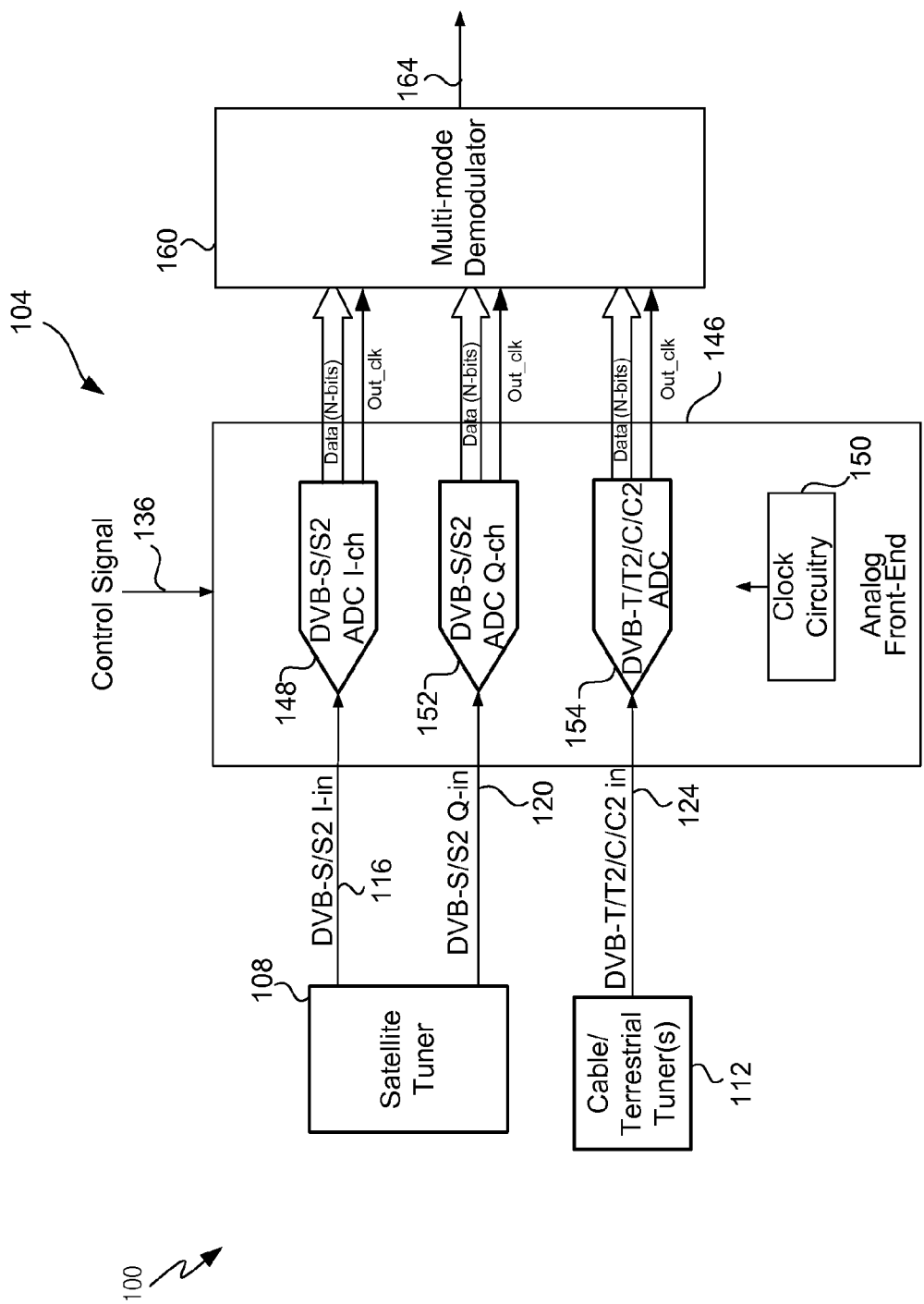
FIG. 1 is a block diagram of a device according to at least one embodiment of the invention.

Referring to FIG. 1, device 100 may include receiver 104, which may be configured to receive radio frequency (RF) signals and to process the RF signals to generate audio and/or video media outputs. In at least one embodiment of communication device 100, receiver 104 forms an integrated satellite, terrestrial and cable broadcast receiver configured to receive RF signals from respective satellite, terrestrial and cable broadcast sources. As used herein, RF signals include electrical signals conveying useful information and having frequencies from kilohertz (kHz) to several hundred gigahertz (GHz), regardless of the medium through which the signals are conveyed. Thus, an RF signal may be transmitted through air, free space, coaxial cable, and/or fiber optic cable, for example. Accordingly, receiver 104 may receive RF signals from a wired or wireless medium.

Device 100 may further include satellite tuner 108 and cable/terrestrial tuner(s) 112. Satellite tuner 108 may generate in-phase (I) and quadrature (Q) signals associated with signals received from satellite sources, represented in FIG. 1 as signals 116 and 120, respectively. Cable/terrestrial tuner(s) 112 may receive signals from cable and terrestrial sources and in response may generate signal 124. Cable/terrestrial tuner(s) 112 may be included in a single apparatus or distributed among separate apparatuses. In at least the embodiment of FIG. 1, signals 116, 120, and 124 are provided to analog-to-digital converters (ADCs) 148, 152 and 154, respectively, in analog front-end 146. Thus, in illustrated embodiments, ADCs 148, 152, and 154 have been configured to process in-phase (I) portions of signals received from satellite sources, quadrature (Q) portions of signals received from satellite sources, and signals received from terrestrial/cable sources, respectively.

In at least one embodiment, control signal 136 determines a mode of operation of ADCs 148, 152, and 154. It should be appreciated that control signal 136 may be a single signal with multiple fields for indicating operation of or separate control signals as required to configure the ADCs for the appropriate mode of operation. According to various embodiments, control signal 136 may be generated by suitable configuration circuitry on-chip such as volatile or non-volatile memory (e.g., within receiver 104) or control signal 136 may be provided from off-chip, or a combination.

In at least one embodiment of communication device 100, ADC 148 is configured to process signals received from terrestrial, cable, and satellite sources. For example, in at least one embodiment, the ADCs 148, 152, and 154 may be configured to process signals associated with Digital Video Broadcasting (DVB) broadcast standards such as DVB-T/T2, DVB-C/C2, and DVB-S/S2, where T/T2 refers to terrestrial, C/C2 refers to cable and S/S2 refers to satellite.

In at least one embodiment, ADCs 148, 152, and 154 each include a delta-sigma modulator. As explained further with reference to FIGS. 3-6, an exemplary delta-sigma modulator includes a modified distributed feed-forward (DFF) topology that significantly reduces out-of-band signal transfer function (STF) peaking to reduce interference caused by out-of-band signals near the desired channel. Some systems that implement delta-sigma modulators and DFF topologies are described in U.S. Pat. No. 7,928,878 to Coban et al., which is incorporated by reference herein in its entirety.

In at least one embodiment, clock circuitry 150 provides one or more clock signals to ADCs 148 and 152. For example, in at least one embodiment, for LIF, ZIF, and standard IF modes of operation, clock circuitry provides one or both of ADCs 148 and 152 a 200 MHz clock signal, a 320 MHz clock signal, and a 320 MHz clock signal, respectively. In at least one embodiment, clock circuitry 150 includes a local oscillator (LO) that generates clock signals having frequencies associated with LIF, ZIF, and standard IF modes, which are mixed with received signals. Of course, those frequencies are exemplary, and other frequencies suitable for the particular application may be provided by clock circuitry 150.

Multi-mode demodulator 160 may perform demodulation operations, such as demodulation of coded orthogonal frequency division multiplexed (COFDM) signals, quadrature amplitude modulated (QAM) signals, quadrature phase-shift keyed/eight phase-shift keyed (QPSK/8PSK) signals, and Multi-level Amplitude Shift Keying (M-ASK). Multi-mode demodulator 160 may output demodulated signal 164, which may be provided off-chip, or which may be provided to additional components of receiver 104, such as equalization circuitry, channel decoding circuitry, and a Moving Picture Experts Group Transport Stream (MPEG TS) interface.

Figure 2:
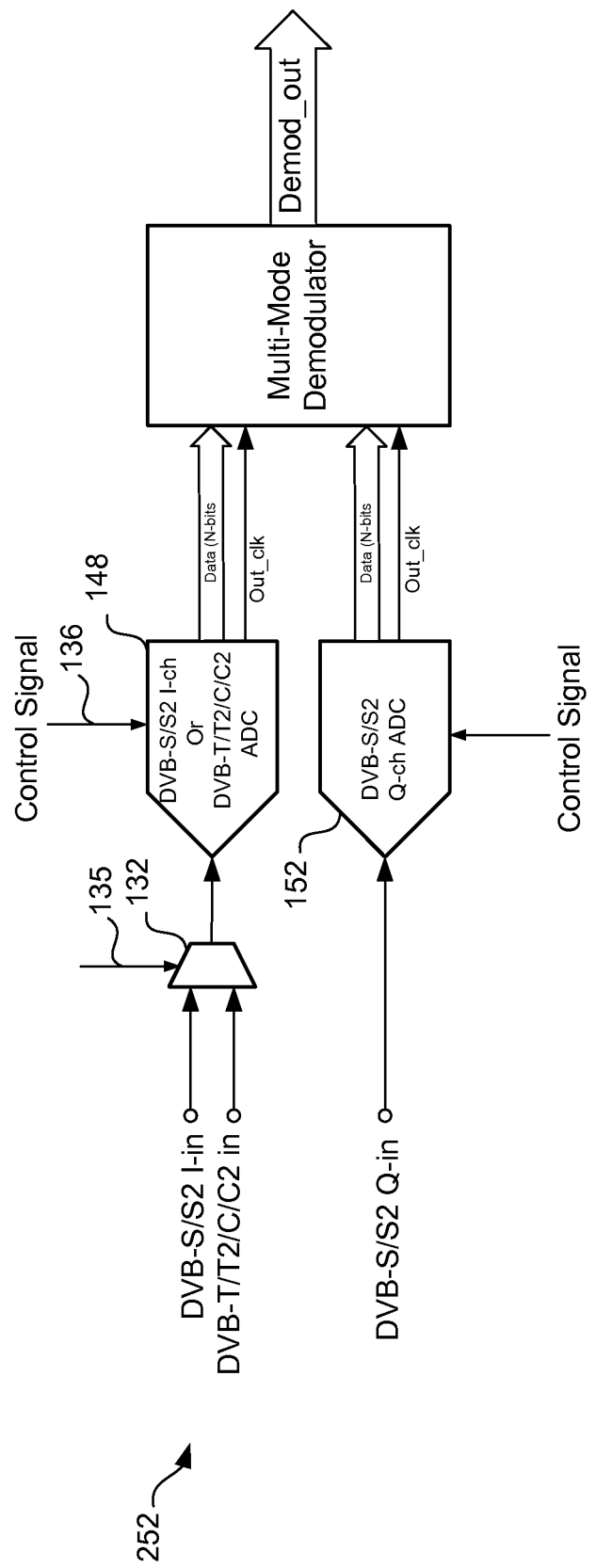
FIG. 2 is a block diagram illustrating an alternative embodiment of the analog front end shown in FIG. 1.

Referring to FIG. 2, a second embodiment of a portion of receiver 104 of FIG. 1 is depicted. In the illustrated embodiment, selection logic 132 is configured to select between I portions of signals received from satellite sources and signals received from terrestrial/cable sources. The selection may occur during manufacturing, e.g., by programming one-time programmable (OTP) memory, programming other nonvolatile or volatile memory after manufacturing, or dynamically during operation (e.g., in response to control signal 136 of FIG. 1) or a combination. In at least one embodiment, ADC 152 is configured to be disabled (e.g., temporarily powered down) when processing of Q-signals is not indicated (e.g., in response to selection of a terrestrial or a cable mode of operation associated with ADC 148). In at least one embodiment, ADC 152 is configured to be disabled in response to a value of control signal 136.

In at least the embodiment depicted in FIG. 2, ADC 148 is configured to process cable/terrestrial signals and I portions of signals received from satellite sources, and ADC 152 is configured to process Q portions of signals received from satellite sources. Configuration of ADCs 148 and 152 may occur during manufacturing, e.g., by programming one-time programmable (OTP) memory, programming other nonvolatile or volatile memory after manufacturing, or dynamically during operation (e.g., in response to control signal 136 of FIG. 1).

In at least the embodiment depicted in FIG. 2, the signals input to ADCs 148 and 152 include DVB-S/S2, DVB-T/T2, and DVB-C/C2 signals. In at least one embodiment of FIG. 2, the signals input to ADCs 148, 152 include any of signals 116, 120, and 124 of FIG. 1. However, it should be appreciated that other suitable signals may be input to ADCs 148 and 152.

Figure 3:
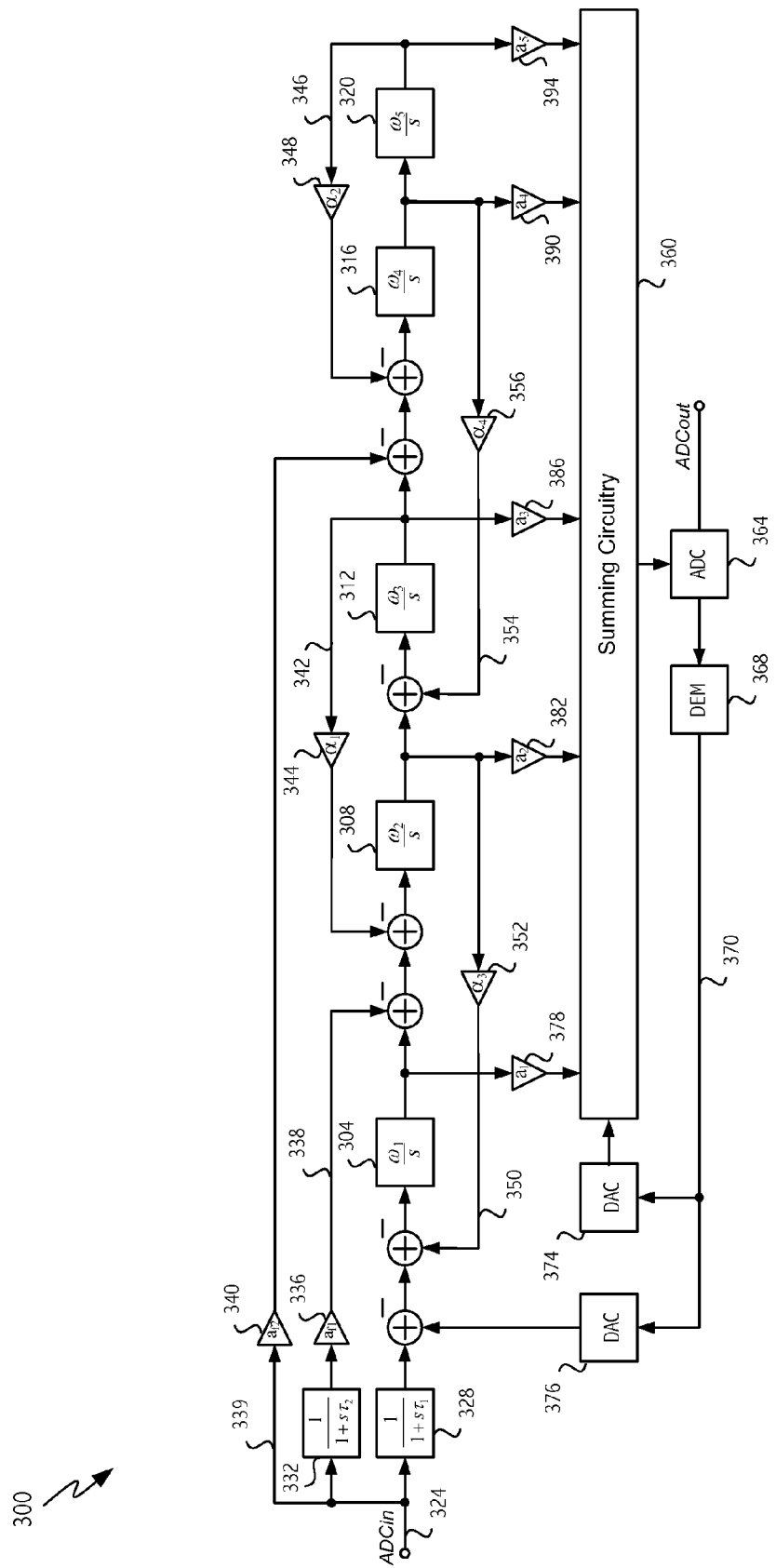
FIG. 3 is a block diagram of an embodiment of a delta-sigma modulator of the communication device of FIG. 1.

Referring to FIG. 3, in at least one embodiment, delta-sigma modulator 300 depicts an exemplary delta-sigma modulator prior to configuration. Note that FIG. 3 is shown as single-ended for ease of illustration. More typically, the circuits present in FIG. 3 are differential. Delta-sigma modulator 300 may be included in any of ADCs 148, 152, and 154 of FIGS. 1 and 2. In at least one embodiment, delta-sigma modulator 300 is of a modified distributed feed-forward (DFF) topology that includes configurable feed-forward and feedback paths, which reduce out-of-band signal transfer function (STF) peaking associated with blockers adjacent to or close to a desired channel, as described further with reference to FIGS. 4-6.

In at least one embodiment, delta-sigma modulator 300 includes multiple integrators, such as integrators 304, 308, 312, 316, and 320. In at least one embodiment, integrators 304, 308, 312, 316, and 320 are continuous-time integrator circuits formed by operational amplifiers coupled to resistors and capacitors, as explained further with reference to FIGS. 7 and 8. In at least one embodiment, integrators 304, 308, 312, 316, and 320 are discrete time integrator circuits, such as switched-capacitor structures and other such structures. In at least one embodiment of delta-sigma modulator 300, integrators 304, 308, 312, 316, and 320 may be scaled by integrator gains $\omega_1$, $\omega_2$, $\omega_3$, $\omega_4$, and $\omega_5$, respectively. Scaling by integrator gains is described further with reference to FIGS. 7-8. In at least one embodiment of delta-sigma modulator 300, at least one integrator (e.g., integrator 320) is configured to be disabled to generate a fourth-order state of delta-sigma modulator 300, as explained further with reference to FIG. 5.

In at least one embodiment, delta-sigma modulator 300 receives analog input signal $ADC_{in}$ at input node 324. Analog input signal $ADC_{in}$ may be a single input signal or a differential signal, where input node 324 includes a pair of differential input nodes. Input node 324 may be coupled to an input of integrator 304 via a pre-filter path that includes pre-filter 328. Input node 324 may be further coupled to an input node of integrator 308 via a feed-forward path 338 that includes pre-filter 332. Pre-filters 328 and 332 may be low-pass filters formed by suitable components, such as resistors and capacitors. In at least one embodiment, either or both of pre-filters 328 and 332 include at least one digitally-configurable capacitor (e.g., a digitally tunable, binary-weighted capacitor bank). In at least one embodiment, suitable calibration circuitry (e.g., included in receiver 104 of FIG. 1) controls configurations of pre-filters 328 and 332.

In at least one embodiment of delta-sigma modulator 300, feed-forward path 338 further includes feed-forward gain circuitry 336 coupled to scale the analog input signal $ADC_{in}$ by a factor of $a_{f1}$. In at least one embodiment of delta-sigma modulator 300, input node 324 is further coupled to an input of integrator 316 via a feed-forward path 339 that includes feed-forward gain circuitry 340 coupled to scale the analog input signal $ADC_{in}$ by a factor of $a_{f2}$. Gain circuitry, such as gain circuitry 336 and 340, may be implemented using gain stages formed by operational amplifiers and other suitable circuits.

In at least the embodiment depicted in FIG. 3, an output of integrator 312 is fed back to an input of integrator 308 via feedback path 342 with a gain ($\alpha 1$) 344, to form a resonator. An output of integrator 320 may be fed back to an input of integrator 316 via a feedback path 346 with a gain ($\alpha 2$) 348, to form a resonator. An output of integrator 308 may be fed back to an input of integrator 304 via feedback path 350 that includes gain ($\alpha 3$) 352, to form a resonator. An output of integrator 316 may be fed back to an input of integrator 312 via a feedback path 354 that includes gain ($\alpha 4$) 356, to form a resonator.

Gain circuitries 378, 382, 386, 390, and 394 may scale outputs of integrators 304, 308, 312, 316, and 320, respectively, by gains $a_1$, $a_2$, $a_3$, $a_4$, and $a_5$, respectively. The scaled outputs may be provided to summing circuitry 360, which may sum the scaled outputs to generate a summed signal. Summing circuitry may provide the summed signal to ADC 364. In at least one embodiment of delta-sigma modulator 300, summing circuitry 360 is responsive to control signal 136 of FIG. 1, which may determine a mode of operation of delta-sigma modulator 300, as explained further with reference to FIG. 9.

ADC 364 (the quantizer) may generate digital output signal $ADC_{out}$, which in at least one embodiment is provided to the multi-mode demodulator of FIG. 1 via output node 396. In at least one embodiment, ADC 364 is a 3-bit quantizer. In at least one embodiment, digital output signal $ADC_{out}$ is processed and fed back to the input of integrator 304 via feedback path 370. For example, as shown in the embodiment of FIG. 3, $ADC_{out}$ may be processed by dynamic element matching (DEM) circuit 368 to compensate for "mismatches" in components of the main feedback digital-to-analog converter (DAC) 376 (e.g., mismatches between circuit design and actual circuit parameters) and converted to an analog representation by DAC 376 before being fed back to the input of integrator 304. In at least one embodiment, DAC 374 provides a feedback signal to summing circuitry 360 to compensate for excess loop delay associated with operation of delta-sigma modulator 300.

Figure 4:
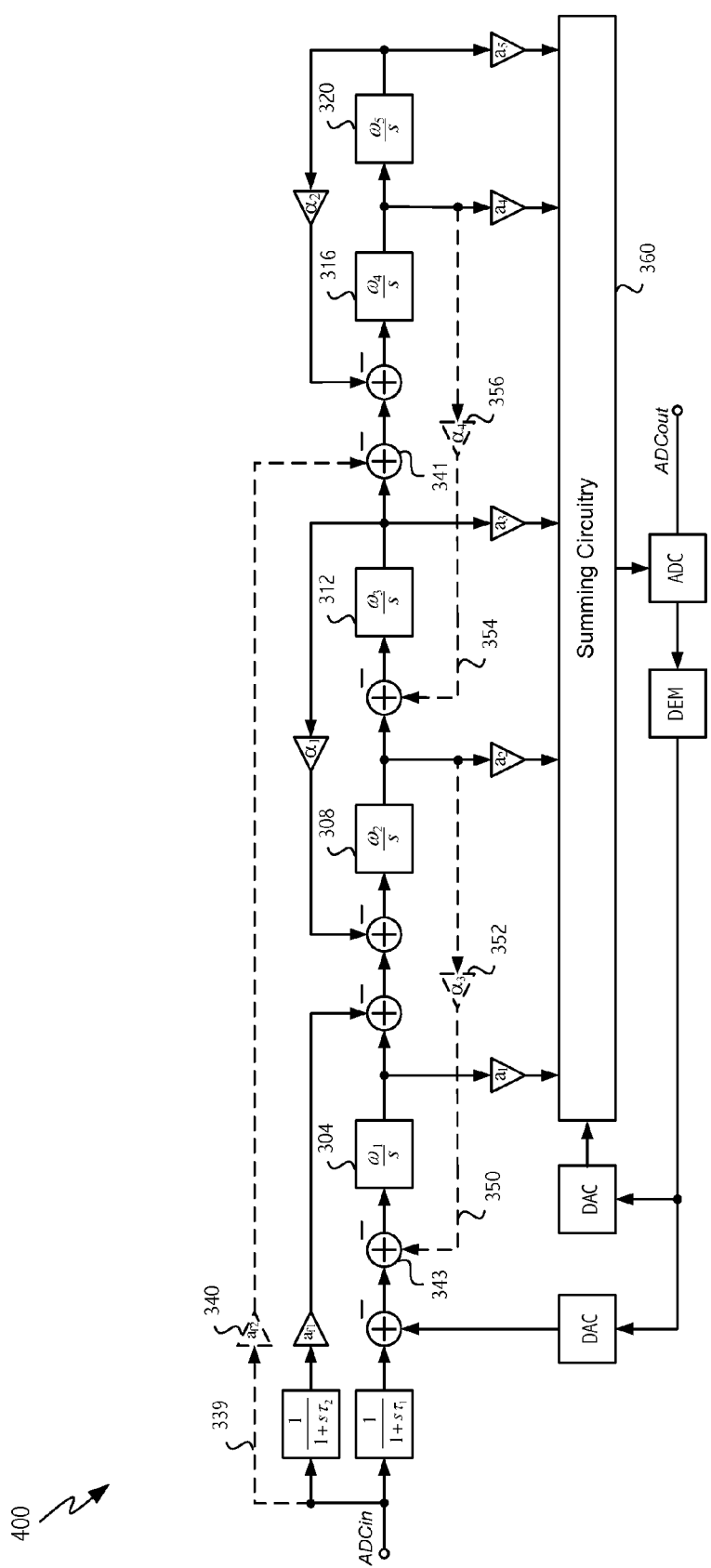
FIG. 4 is a block diagram of an embodiment of a delta-sigma modulator of the communication device of FIG. 1.

Referring to FIG. 4, in at least one embodiment, delta-sigma modulator 400 illustrates delta-sigma modulator 300 of FIG. 3 after configuration. Note that FIG. 4 is shown as single-ended for ease of illustration. More typically, the circuits present in FIG. 4 are differential. In at least the embodiment of FIG. 4, delta-sigma modulator 400 is configured in a fifth-order mode of operation. In at least one embodiment, the configuration of delta-sigma modulator 400 corresponds to a low-pass filter mode. The low-pass filter mode may further include separate ZIF and LIF operating modes, as explained further below.

In at least the embodiment depicted in FIG. 4, configuring delta-sigma modulator 400 in the low-pass filter configuration includes disabling feed-forward path 339 (e.g., by disabling feed-forward gain 340), disabling feedback path 350 (e.g., by disabling gain circuit 352), and disabling feedback path 354 (e.g., by disabling gain circuit 356). The feedback paths may be disabled by turning off power to selected circuitry and/or selecting, e.g., via a switch, an input for summing circuits 341 and 343 different from the feedback path. Turning off power to unused circuitry has the advantage of saving power.

In at least one embodiment, the low-pass filter mode may be configured in any of multiple sub-modes. For example, delta-sigma modulator 400 may be configured differently based on whether analog front-end 146 of FIG. 1 operates in ZIF or LIF mode. Configuring delta-sigma modulator 400 for ZIF or LIF modes may include adjusting integrator gains $\omega_1$, $\omega_2$, $\omega_3$, $\omega_4$, and $\omega_5$ and feed-forward gains $a_1$, $a_2$, $a_3$, $a_4$, and $a_5$ of integrators 304, 308, 312, 316, and 320 to correspond to the selected mode of operation (e.g., by controlling corner frequencies associated with integrators 304, 308, 312, 316, and 320). Configuring delta-sigma modulator 400 may occur during manufacturing, e.g., by programming one-time programmable (OTP) memory, programming other nonvolatile or volatile memory after manufacturing, or dynamically during operation using, e.g., digitally switchable components. In at least one embodiment, summing circuitry 360 is responsive to control signal 136 of FIG. 1, which may determine the mode of operation of delta-sigma modulator 400, as explained further with reference to FIG. 9.

Figure 5:
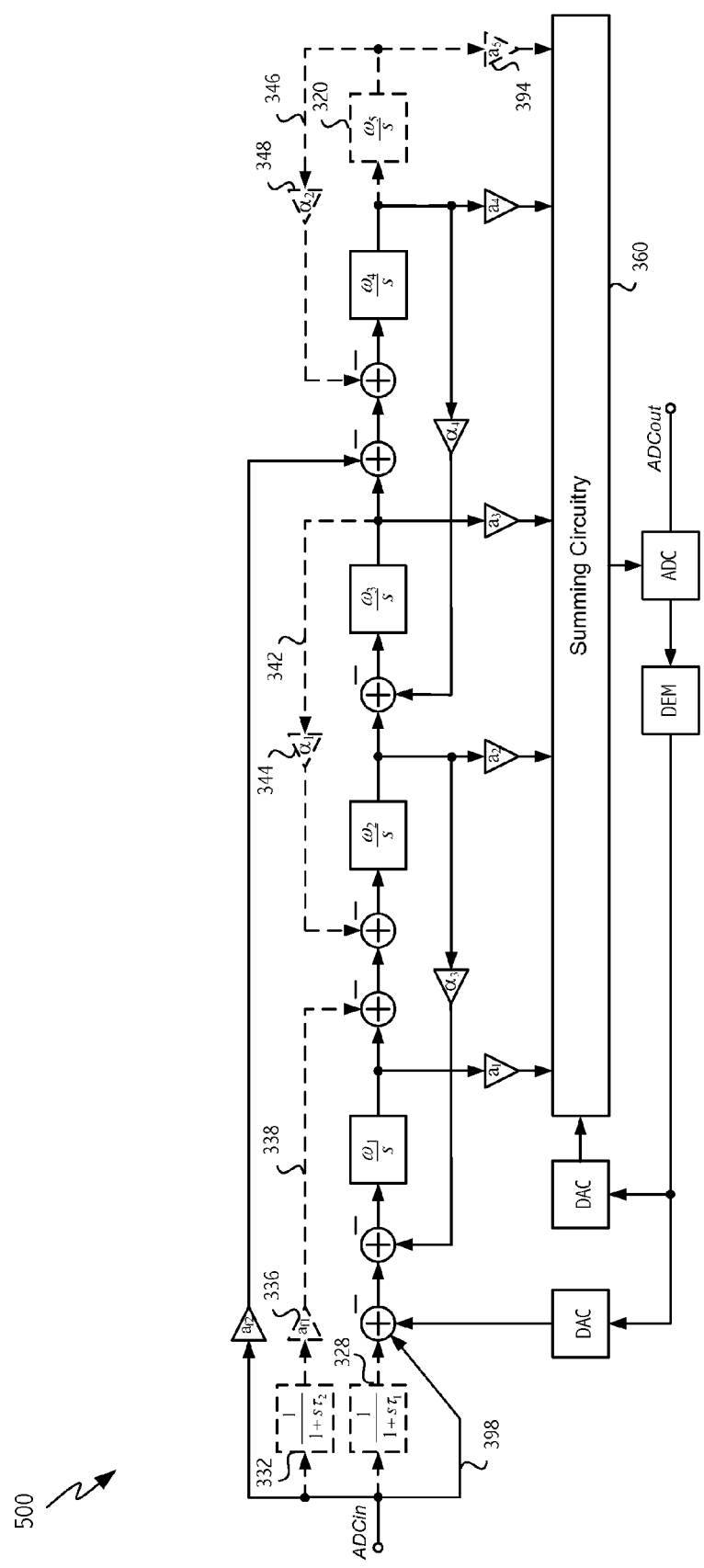
FIG. 5 is a block diagram of an embodiment of a delta-sigma modulator of the communication device of FIG. 1.

Referring to FIG. 5, in at least one embodiment, delta-sigma modulator 500 illustrates delta-sigma modulator 300 of FIG. 3 after configuration. Note that FIG. 5 is shown as single-ended for ease of illustration. More typically, the circuits present in FIG. 5 are differential. In at least the embodiment depicted in FIG. 5, delta-sigma modulator 500 is configured in a fourth-order mode of operation. In at least one embodiment, the configuration of delta-sigma modulator 500 corresponds to a band-pass filter mode. In at least the embodiment depicted in FIG. 5, configuring delta-sigma modulator 500 in the band-pass configuration includes disabling integrator 320 to generate a fourth-order configuration of delta-sigma modulator 500. Disabling integrator 320 may include disabling one or more of gain circuitry 348, feedback path 346, and gain circuit 394. In at least the embodiment depicted in FIG. 5, configuring delta-sigma modulator 500 in the band-pass configuration further includes disabling feed-forward path 338 (e.g., by disabling pre-filter 332, gain circuitry 336, or a combination thereof), disabling feedback path 342 (e.g., by disabling gain circuitry 344), and bypassing input pre-filter 328 (e.g., by disabling input pre-filter 328 and using bypass path 398). Configuring delta-sigma modulator 500 may occur during manufacturing, e.g., by programming one-time programmable (OTP) memory, programming other nonvolatile or volatile memory after manufacturing, or dynamically during operation. In at least one embodiment, the band-pass filter mode of delta-sigma modulator 500 is associated with a standard intermediate frequency mode of operation of analog front-end 146 of FIG. 1. In at least the embodiment of FIG. 3, summing circuitry 360 is responsive to control signal 136, which may determine the mode of operation of delta-sigma modulator 500, as explained further with reference to FIG. 9.

Figure 6A:
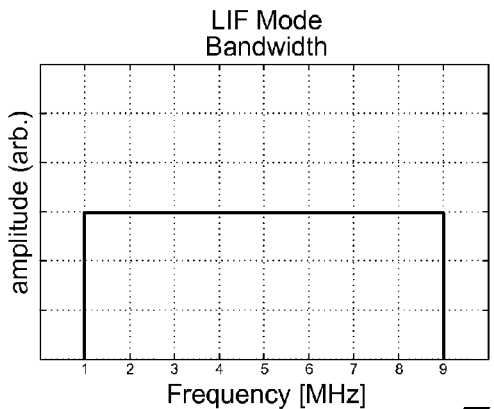
FIG. 6*a* illustrates exemplary bandwidths corresponding to a low-intermediate frequency (LIF) mode signal and a corresponding noise transfer function (NTF) consistent with at least one embodiment of the invention.
Figure 6A:
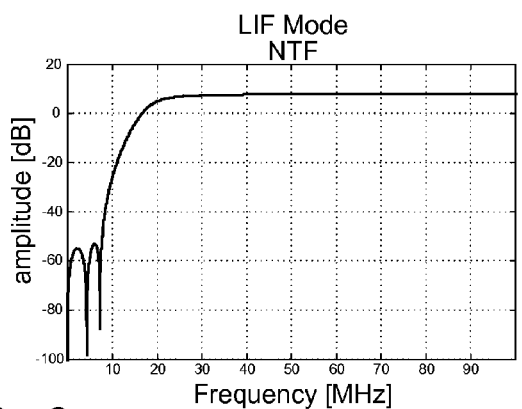

Referring to FIG. 6a, operating bandwidth and an associated noise-transfer function (NTF) are depicted for an embodiment of delta-sigma modulator 400 of FIG. 4 configured in a low-pass filter mode and for LIF operation. As shown in FIG. 6a, the low-pass filter, LIF mode may pass signal frequencies from approximately 1 to 9 MHz (e.g., centered around approximately 4 to 5 MHz). In at least one embodiment, the low-pass filter, LIF mode may be used for reception of one or both of a cable television signal and a terrestrial television signal (e.g., one of a DVB-C signal and a DVB-T/T2 signal). In at least the embodiment shown in FIG. 6a, for the low-pass filter, LIF mode configuration, the amplitude of the NTF in this range of frequencies has been significantly attenuated.

Figure 6B:
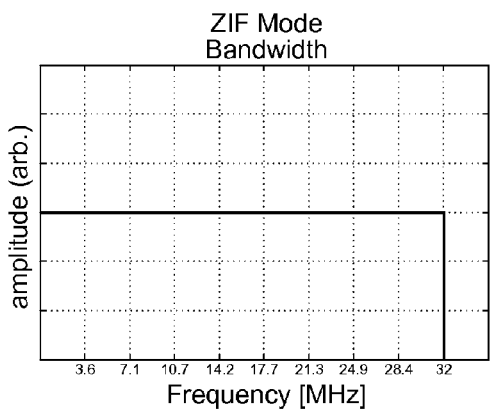
FIG. 6*b* illustrates exemplary bandwidths corresponding to a zero-intermediate frequency (ZIF) mode signal and a corresponding NTF consistent with at least one embodiment of the invention.
Figure 6B:
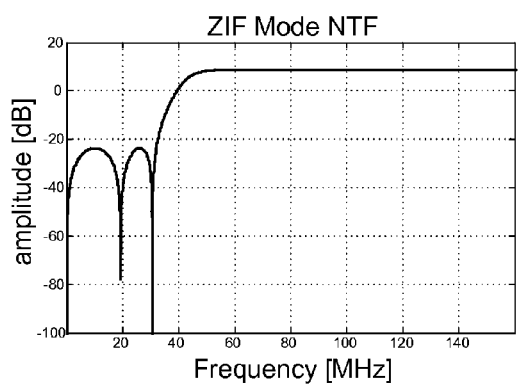

Referring to FIG. 6b, operating bandwidth and an associated NTF are depicted for an embodiment of delta-sigma modulator 400 of FIG. 4 configured in a low-pass filter mode and for ZIF operation. As shown in FIG. 6b, the low-pass filter, ZIF mode may pass signal frequencies from approximately 0 to 32 MHz. In at least one embodiment, the low-pass filter, ZIF mode may be used for reception of a satellite television signal (e.g., a DVB-S/S2 signal). In at least the embodiment shown in FIG. 6b, for the low-pass filter, ZIF mode configuration, the amplitude of the NTF in this range of signal frequencies has been significantly attenuated.

Figure 6C:
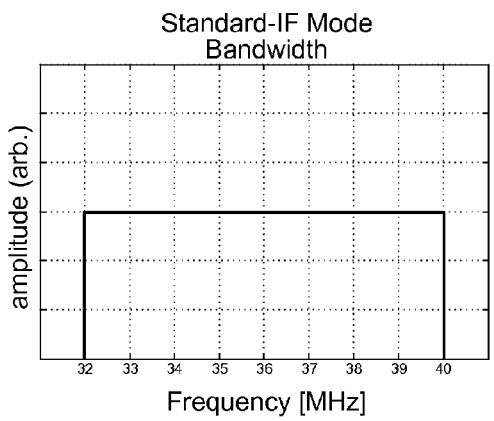
FIG. 6*c* illustrates exemplary bandwidths corresponding to a standard intermediate frequency mode signal and a corresponding NTF consistent with at least one embodiment of the invention.
Figure 6C:
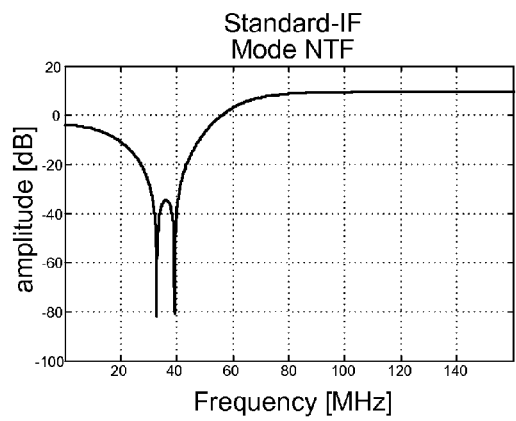

Referring to FIG. 6c, bandwidth and an associated NTF are depicted for an embodiment of delta-sigma modulator 500 of FIG. 5 configured in a band-pass filter mode. As shown in FIG. 6c, the band-pass filter mode may pass signal frequencies from approximately 32 to 40 MHz (e.g., centered around approximately 36 MHz). In at least one embodiment, the band-pass filter mode corresponds to a standard-IF mode of operation used to receive signals compliant with various European television broadcast specifications. In at least the embodiment shown in FIG. 6c, for the band-pass filter configuration, the amplitude of the NTF in this range of signal frequencies has been significantly attenuated.

Referring to FIG. 3, the feed-forward paths 333 and 338 along with pre-filters 328 and 332 help ensure that the dynamic range of the ADC is not limited by STF peaking STF peaking will cause undesired (out-of-band) signals to be amplified more than the desired (in-band) signals. Paths 338 and 339 help reduce the amplification of the undesired signals. Having a lower in-band NTF increases the dynamic range of the ADC by suppressing the quantization noise generated by the ADC (364). Maintaining the dynamic range of the ADC helps allow a single programmable ADC to operate in a variety of modes.

Figure 7:
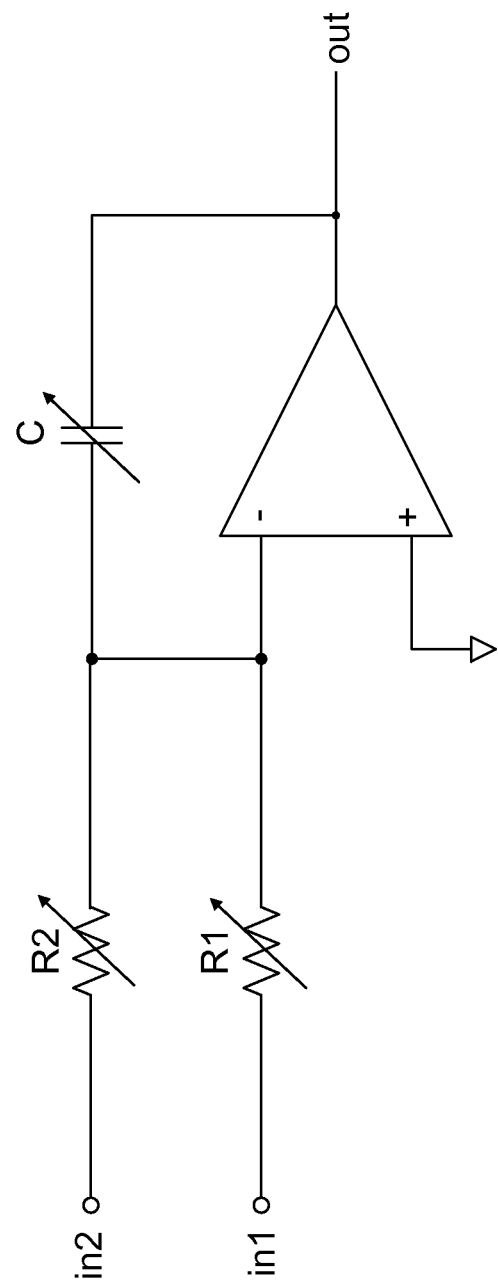
FIG. 7 is a schematic diagram of an embodiment of a single-ended integrator of one or more of the delta-sigma modulators of FIGS. 3-5.

Referring to FIG. 7, in at least one embodiment, single-ended integrator 700 corresponds to any of integrators 304, 308, 312, 316, and 320 of FIGS. 3-5. In at least one embodiment, integrator 700 includes variable resistors R1 and R2, which may be implemented physically as multiple resistors with switches to adjust the resistance. Integrator gain for the various ADC modes described herein may be configured by adjusting R1 and R2. Thus, e.g., as described previously with reference to FIG. 4, ZIF and LIF modes of a fourth-order delta-sigma modulator (e.g., delta-sigma modulator 400 as configured in FIG. 4) may be configured in part by configuring a gain ω of one or more of integrators 304, 308, 312, 316, and 320 of FIGS. 3-5. Note that integrator 320 has only one input (no R2), while integrators 308 and 316 have three inputs. The resistors may be configured during manufacturing, by programming one-time programmable (OTP) memory, or other volatile or nonvolatile memory, or any other suitable approach for setting the resistance.

Integrator 700 may further includes programmable feedback capacitor C, which may be configured to alter an RC time constant associated with integrator 700. Capacitor C may be implemented as multiple capacitors with switches to adjust the capacitance. Calibration of the RC time constant may be utilized to account for process variations.

Figure 8:
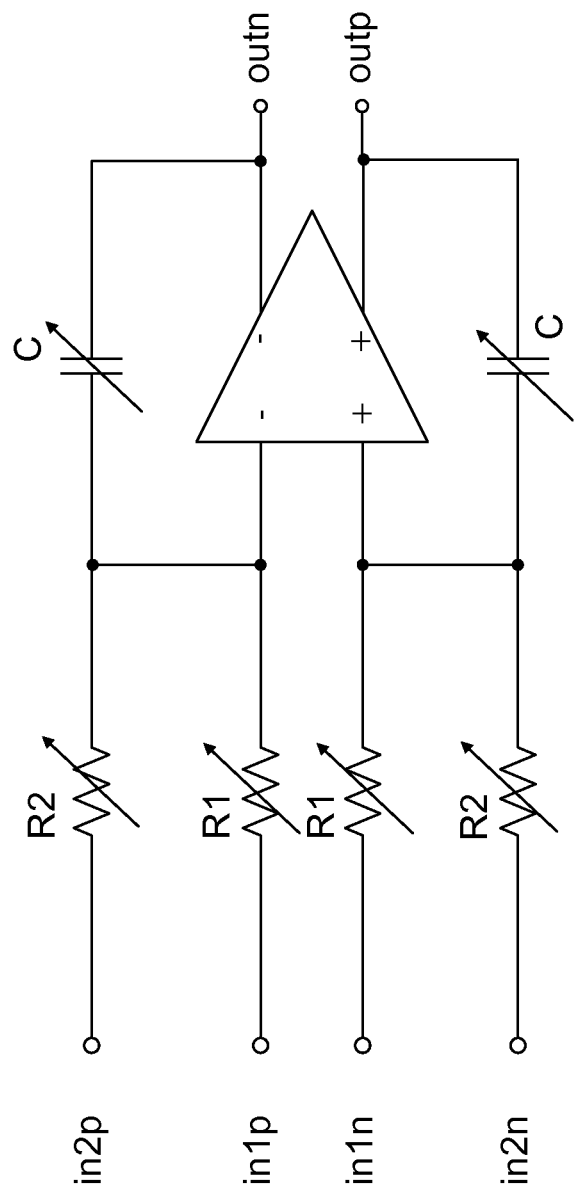
FIG. 8 is a schematic diagram of an embodiment of a differential integrator of one or more of the delta-sigma modulators of FIGS. 3-5.

While FIG. 7 illustrates a single-ended implementation of an integrator, a differential integrator is more typically found in embodiments described herein. Referring to FIG. 8, in at least one embodiment, an exemplary differential integrator 800 corresponds to one or more of integrators 304, 308, 312, 316, and 320 of FIGS. 3-5. In the embodiment depicted in FIG. 8, differential integrator 800 is coupled to receive differential inputs in2p, in1p, in1n, and in2p and is further coupled to generate a differential pair of outputs, outp and outn. The variable resistors R1 and R2, which may be implemented physically as multiple resistors, may be adjusted to adjust the integrator gain to be suitable for the various modes described herein (e.g. ZIF, LIF, standard IF modes). Note that modifications may need to be made to integrator 800 to account for the different numbers of differential inputs (other than two pairs) being supplied to the integrator. For example, integrator 320 has only one input, which is supplied from integrator 316. Thus, the resistor paths including R2 are not present as in2p and in2n are not present. For integrator 304, the ADC input 324 is coupled to in1p and in1n through pre-filter 328. The differential output of integrator 308 is coupled to the other inputs of the integrator (in2p and in2n) through feedback path 350. The gain 352 is provided by the ratio of R2 and R1. For integrator 312 the output of integrator 308 is connected to in1p and in1n. Note that integrators 308 and 316 have three inputs and appropriate adaptations of the multi-input integrator shown in FIG. 8 to accommodate the three input terms would be well understood by those of skill in the art.

Thus, the gain ω of one or more of integrators 304, 308, 312, 316, and 320 of FIGS. 3-5 may be configured by adjusting variable resistors of the integrator. The resistors may configured during manufacturing by programming one-time programmable (OTP) memory or other volatile or nonvolatile memory, or any other suitable approach for setting the resistance during manufacturing, test, or operation.

Figure 9:
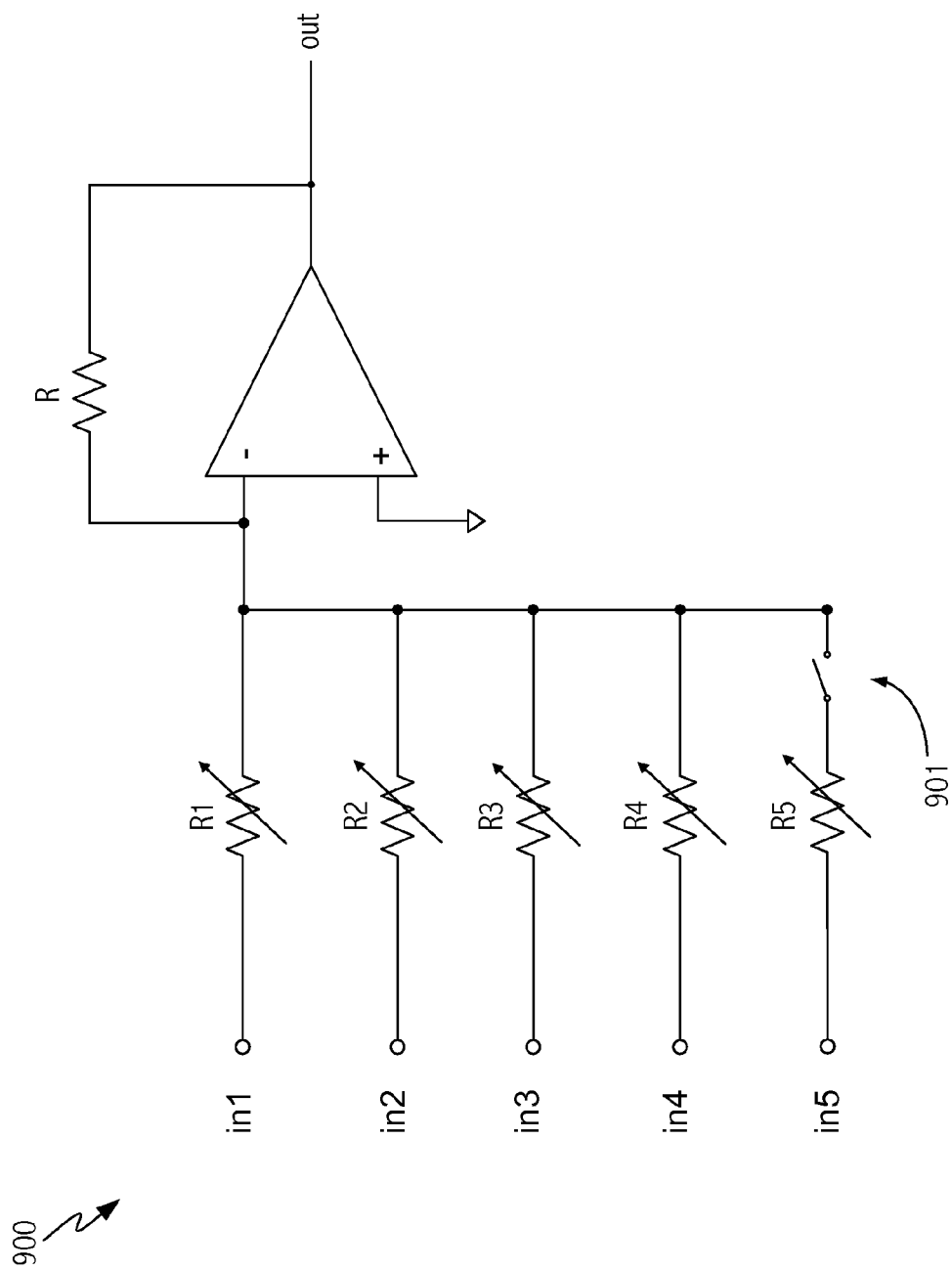
FIG. 9 is a schematic diagram of an embodiment of summing circuitry included in one or more of the delta-sigma modulators of FIGS. 3-5.

Referring to FIG. 9, in at least one embodiment, summing circuit 900 corresponds to summing circuitry 360 of any of FIGS. 3-5. Note that while FIG. 9 illustrates the summing circuit as a single-ended circuit for ease of illustration, a more typical implementation would utilize a differential summing circuit. Note that all five input resistor branches R1-R5 have programmable resistors (physically comprised of multiple resistors and switches) in order to realize the various coefficients (a1, a2, a3, a4 a5) required for different modes. Note also that when an integrator stage is disabled, e.g., in the fourth-order ADC mode illustrated in FIG. 5, a switch 901 is open to prevent contribution to the summing circuit of the disabled integrator 320.

The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. An apparatus comprising:
a delta-sigma modulator configurable to operate in a low-pass filter mode and further configurable to operate in a band-pass filter mode; and
selection logic coupled to the delta-sigma modulator, the selection logic configured to select between at least a first signal and a second signal to be input to the delta-sigma modulator.

2. The apparatus as recited in claim 1
wherein in the low-pass filter mode the delta-sigma modulator is configured as a mth-order delta-sigma modulator, and
wherein in the band-pass filter mode the delta-sigma modulator is configured as an nth-order delta-sigma modulator,
where m and n are integers.

3. The apparatus as recited in claim 1
wherein in the low-pass filter mode the delta-sigma modulator is configured as a fifth-order delta-sigma modulator, and
wherein in the band-pass filter mode the delta-sigma modulator is configured as a fourth-order delta-sigma modulator.

4. The apparatus as recited in claim 1
wherein the low-pass filter mode includes a first low-pass filter mode associated with a low-intermediate frequency (LIF) mode and a second low-pass filter mode associated with a zero-intermediate frequency (ZIF) mode of a receiver that includes the delta-sigma modulator and the selection logic, and
wherein the band-pass filter mode is associated with a higher intermediate frequency mode of the receiver.

5. The apparatus as recited in claim 4
wherein in the LIF mode the delta-sigma modulator is configured to pass analog-to-digital converter signal frequencies of a first frequency range,
wherein in the ZIF mode the delta-sigma modulator is configured to pass analog-to-digital converter signal frequencies of a second frequency range, and
wherein in a higher intermediate frequency (IF) mode the delta-sigma modulator is configured to pass analog-to-digital converter signal frequencies of a third frequency range.

6. The apparatus as recited in claim 5
wherein the first frequency range is approximately 1 to 9 MHz,
wherein of the second frequency range is approximately 0 to 32 MHz, and
wherein in the third frequency range is approximately 32 to 40 MHz.

7. The apparatus as recited in claim 1 further comprising:
a second delta-sigma modulator responsive to a third signal.

8. The apparatus as recited in claim 7
wherein the first signal is associated with one of a terrestrial television signal and a cable television signal,
wherein the second signal is associated with an in-phase component of a satellite television signal, and
wherein the third signal is associated with a quadrature component of the satellite television signal.

9. A method of configuring an analog-to-digital converter (ADC), the method comprising:
configuring the ADC according to a value of a control signal to operate in a low-pass filter mode or a band-pass filter mode including configuring a first number of integrators to be operable in the ADC in the low-pass filter mode and a second number of integrators to be operable in the ADC in the band-pass filter mode.

10. The method as recited in claim 9 further comprising:
disabling a feed-forward path of the ADC in response to the control signal having a first value.

11. The method as recited in claim 10 further comprising:
configuring an integrator gain of the ADC and a feed-forward gain of the ADC based on selection of a low-intermediate frequency (LIF) mode or a zero-intermediate frequency (ZIF) mode.

12. The method as recited in claim 11 further comprising:
disabling a second ADC based on the value of the control signal.

13. The method as recited in claim 9 further comprising:
disabling an integrator of the ADC in response to the control signal having a second value.

14. An apparatus comprising:
analog-to-digital converter (ADC) comprising:
a first integrator, a second integrator, a third integrator, a fourth integrator, and a fifth integrator,
wherein the fifth integrator is configurable to be disabled in response to a control signal.

15. The apparatus as recited in claim 14
wherein a disabled state of the fifth integrator corresponds to a band-pass filter mode, the band-pass filter mode associated with a higher intermediate frequency mode of the ADC, and
wherein an enabled state of the fifth integrator corresponds to a first low-pass filter mode or a second low-pass filter mode, the first low-pass filter mode associated with a low-intermediate frequency (LIF) mode of the ADC and the second low-pass filter mode associated with a zero-intermediate frequency (ZIF) mode of the ADC.

16. The apparatus as recited in claim 15 further comprising:
a first resonator formed by coupling a first feedback path from an output of the third integrator to an input of the second integrator; and
a second resonator formed by coupling a second feedback path from an output of the fifth integrator to an input of the fourth integrator,
wherein the first resonator and the second resonator are configurable to be disabled in response to selection of the disabled state.

17. The apparatus as recited in claim 16 further comprising:
- a feed-forward path from an input of the ADC to the input of the second integrator; and
- a pre-filter path from the input of the ADC to an input of the first integrator,
- wherein the feed-forward path and the pre-filter path are configurable to be disabled in response to selection of the disabled state.

18. The apparatus as recited in claim 17
- wherein the feed-forward path includes a first pre-filter configurable to be disabled in response to selection of the disabled state, and
- wherein the pre-filter path includes a second pre-filter configured to be disabled in response to selection of the disabled state.

19. The apparatus as recited in claim 15 further comprising:
- a third resonator formed by coupling a third feedback path from an output of the second integrator to an input of the first integrator; and
- a fourth resonator formed by coupling a fourth feedback path from an output of the fourth integrator to an input of the third integrator,
- wherein the third resonator and the fourth resonator are configured to be disabled in response to selection of the enabled state.

20. The apparatus as recited in claim 15 further comprising:
- a feed-forward path from an input of the ADC to an input of the fourth integrator,
- wherein the feed-forward path is configurable to be disabled in response to selection of the enabled state.

21. The apparatus as recited in claim 20 further comprising:
- multiple integrator gain circuits and multiple feed-forward gain circuits configurable in response to selection between the first low-pass filter mode and the second low-pass filter mode.

22. The apparatus as recited in claim 14 further comprising:
- selection logic coupled to the ADC, the selection logic coupled to select between multiple input signals to be input to the ADC,
- wherein the control signal further indicates which of the multiple input signals is to be input to the ADC.

* * * * *